US012796349B2

(12) United States Patent
You et al.

(10) Patent No.: US 12,796,349 B2
(45) Date of Patent: Nov. 10, 2026

(54) SEMICONDUCTOR DEVICE, METHOD FOR MANUFACTURING SEMICONDUCTOR DEVICE AND MEMORY

(71) Applicant: CHANGXIN MEMORY TECHNOLOGIES, INC., Hefei City (CN)

(72) Inventors: Kang You, Hefei City (CN); Jie Bai, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 805 days.

(21) Appl. No.: 18/098,042

(22) Filed: Jan. 17, 2023

(65) Prior Publication Data

US 2024/0006175 A1 Jan. 4, 2024

(30) Foreign Application Priority Data

Jul. 4, 2022 (CN) ......................... 202210786559.6

(51) Int. Cl.

| | |
|---|---|
| ***H10P 14/20*** | (2026.01) |
| ***G11C 11/401*** | (2006.01) |
| ***H10B 12/00*** | (2023.01) |
| ***H10D 30/69*** | (2025.01) |

(Continued)

(52) U.S. Cl.

CPC ........ *H10P 14/3434* (2026.01); *G11C 11/401* (2013.01); *H10B 12/01* (2023.02); *H10D 30/792* (2025.01); *H10P 32/30* (2026.01); *H10P 50/691* (2026.01)

(58) Field of Classification Search

CPC ............. H01L 21/02565; H01L 21/308; H01L 21/3215; G11C 11/401; H10B 12/01; H10B 12/09; H10D 30/792; H10D 30/751; H10D 64/667; H10D 64/514; H10D 84/83; H10D 84/0167; H10D 84/0177; H10D 84/0181; H10D 84/85; H10D 84/0128; H10D 84/038; H10D 84/014; H10D 84/0144;

(Continued)

(56) References Cited

U.S. PATENT DOCUMENTS 6,436,777 B1 * 8/2002 Ota .................. H01L 21/28194 257/411
6,762,952 B2 * 7/2004 Munden .................. G11C 11/15 365/158

(Continued)

*Primary Examiner* — Dale E Page
*Assistant Examiner* — Quovaunda Jefferson
(74) *Attorney, Agent, or Firm* — Syncoda LLC; Feng Ma

(57) ABSTRACT

A method for manufacturing a semiconductor device is provided. The method includes: a substrate is provided, the substrate being provided with a first device area and a second device area with different doping types; a gate oxide layer which covers the first device area and the second device area is formed; a gate conductive layer which covers the gate oxide layer is formed; a first gate structure is formed on the first device area, the first gate structure including the gate conductive layer and the gate oxide layer; a second gate structure is formed on the second device area, the second gate structure including the gate conductive layer and the gate oxide layer. In the first device area and the second device area, the gate conductive layer always covers the gate oxide layer.

15 Claims, 14 Drawing Sheets

(51) Int. Cl.
*H10P 32/30* (2026.01)
*H10P 50/00* (2026.01)

(58) Field of Classification Search
CPC . H10D 84/0172; H10P 14/3434; H10P 32/30; H10P 50/691
See application file for complete search history.

(56) References Cited

U.S. PATENT DOCUMENTS

| | | | | |
|---|---|---|---|---|
| 7,585,787 | B2 * | 9/2009 | Cha | H10D 64/664<br>438/785 |
| 2003/0207555 | A1 * | 11/2003 | Takayanagi | H10D 84/038<br>438/285 |
| 2008/0272435 | A1 | 11/2008 | Chien-Ting | |
| 2010/0167482 | A1 * | 7/2010 | Mori | H10D 84/038<br>257/E21.409 |

* cited by examiner

SEMICONDUCTOR DEVICE, METHOD FOR MANUFACTURING SEMICONDUCTOR DEVICE AND MEMORY

CROSS-REFERENCE TO RELATED APPLICATION

This application claims priority to Chinese Patent Application No. 202210786559.6, filed on Jul. 4, 2022 and entitled "SEMICONDUCTOR DEVICE, METHOD FOR MANUFACTURING SEMICONDUCTOR DEVICE AND MEMORY", the contents of which are hereby incorporated by reference in its entirety.

BACKGROUND

With the continuous development of semiconductor devices, the feature sizes of transistors in the semiconductor devices are continuously reduced. The reduced feature sizes bring more challenges to the performance of the transistors. There are still shortcomings in the current transistor manufacturing technology. How to optimize the transistor manufacturing technology to stabilize the performance of transistors is an urgent problem to be solved at this stage.

SUMMARY

Embodiments of the present disclosure relate to the technical field of semiconductors, and in particular to a semiconductor device, a method for manufacturing a semiconductor device, and a memory.

According to a first aspect of the embodiments of the present disclosure, a method for manufacturing a semiconductor device is provided, including the following operations.

A substrate is provided. The substrate is provided with a first device area and a second device area, and a doping type of the first device area is different from a doping type of the second device area.

A gate oxide layer which covers the first device area and the second device area is formed.

A gate conductive layer which covers the gate oxide layer is formed.

A first gate structure is formed on the first device area. The first gate structure includes the gate conductive layer and the gate oxide layer.

A second gate structure is formed on the second device area. The second gate structure includes the gate conductive layer and the gate oxide layer. In the first device area and the second device area, the gate conductive layer covers the gate oxide layer.

According to a second aspect of the embodiments of the present disclosure, a semiconductor structure is provided, including:

- a substrate, where the substrate is provided with a first device area and a second device area, and a doping type of the first device area is different from a doping type of the second device area;
- a gate oxide layer located on the first device area and the second device area;
- a gate conductive layer located on the gate oxide layer.
- a first gate structure, where the first gate structure includes the gate conductive layer and the gate oxide layer, and the first gate structure is located on the first device area; and
- a second gate structure, where the second gate structure includes the gate conductive layer and the gate oxide layer, and the second gate structure is located on the second device area.

According to a third aspect of the embodiments of the present disclosure, a memory is provided, including: a storage cell and a control circuit coupled to the storage cell.

The storage cell is configured to store data.

The control circuit is configured to control the storage cell to perform a read or write operation. The control circuit includes a semiconductor device including:

- a substrate, where the substrate is provided with a first device area and a second device area, and a doping type of the first device area is different from a doping type of the second device area;
- a gate oxide layer located on the first device area and the second device area;
- a gate conductive layer located on the gate oxide layer:
- a first gate structure, where the first gate structure includes the gate conductive layer and the gate oxide layer, and the first gate structure is located on the first device area; and
- a second gate structure, where the second gate structure includes the gate conductive layer and the gate oxide layer, and the second gate structure is located on the second device area.

DETAILED DESCRIPTION

Figure 1:
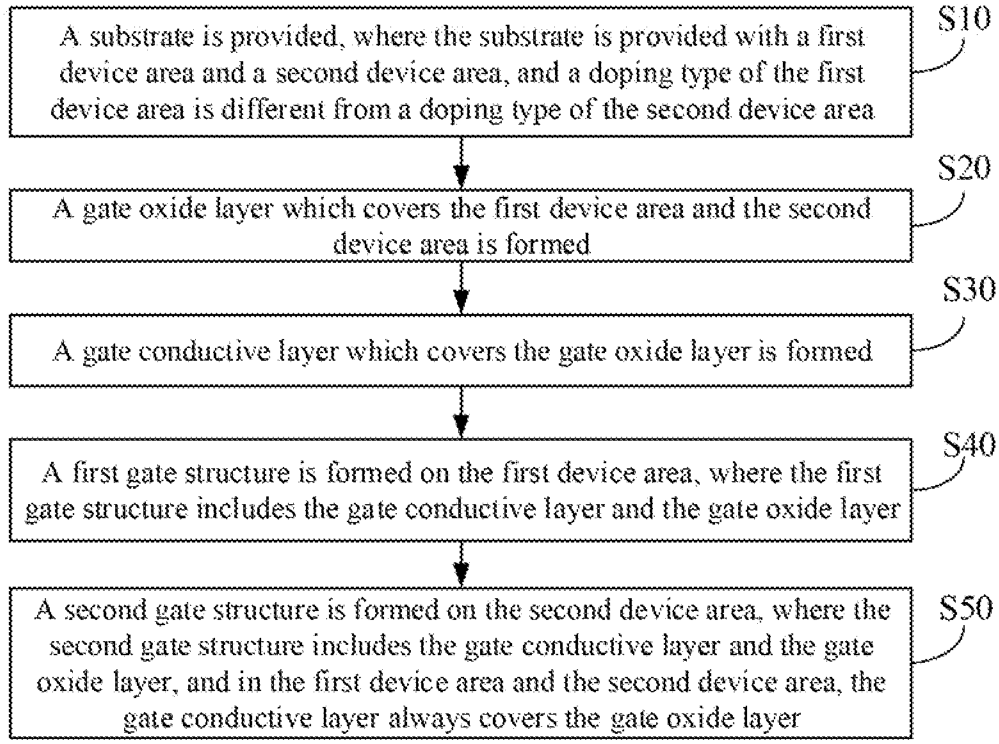
FIG. 1 is a flowchart of a method for manufacturing a semiconductor device according to an embodiment of the present disclosure.

The technical solutions of the present disclosure will further be elaborated below in combination with the drawings and the embodiments. Although the exemplary implementation modes of the present disclosure are shown in the drawings, it should be understood that the present disclosure may be implemented in various forms and shall not be limited by the implementation modes described here. Rather, these implementation modes are provided in order to have a more thorough understanding of the present disclosure and to be able to fully convey the scope of the present disclosure to those skilled in the art.

The present disclosure is more specifically described below by means of examples. The advantages and features of the present disclosure will be clearer according to the following specification and claims. It is to be noted that the accompanying drawings are all in a very simplified form with imprecise proportion to assist in illustrating the purpose of the embodiments of the present disclosure easily and clearly.

It is understandable that the meaning of "on", "over" and "above" in the present disclosure should be interpreted in the broadest possible way. so that "on" means not only that an object is on something without intermediate features or layers (that is, the object is directly on something), but also that an object is on something with intermediate features or layers.

Terms "first", "second", "third" and the like in the embodiments of the present disclosure are adopted to distinguish similar objects and not intended to describe a specific sequence or order.

In the embodiments of the present disclosure, term "layer" refers to a material part that includes an area with thickness. The layer may extend over the whole of a lower or upper structure, or may have a scope smaller than the scope of the lower or upper structure. Moreover, the layer may be an area of a homogeneous or heterogeneous continuous structure whose thickness is less than the thickness of a continuous structure. For example, the layer may be located between the top surface and the bottom surface of the continuous structure, or the layer may be located between any horizontal surfaces at the top surface and bottom surface of the continuous structure. The layer may extend horizontally, vertically and/or along an inclined surface. The layer may include multiple sub-layers.

It is to be noted that the technical solutions recorded in the embodiments of the present disclosure may be freely combined without conflicts.

With the miniaturization of Metal Oxide Semiconductor Field Effect Transistors (MOSFET), a High-K Metal Gate (HKMG) technology has been widely used in the transistor manufacturing technology. For example, the HKMG technology is used in peripheral transistors of memory devices to replace the traditional gate stack (a silicon dioxide gate oxide layer and a polycrystalline silicon gate) technology.

When the HKMG technology is used to prepare transistors, a high dielectric material as an insulating material usually has a high dielectric constant and a relatively large band gap, which is more stable than silicon. Therefore, a high dielectric insulating layer made of the high dielectric material can improve the performance of the transistors. The HKMG technology can not only greatly reduce the leakage of the gate, but also effectively reduce gate capacitance due to the thin Equivalent Oxide Thickness (EOT) of the high dielectric insulating layer, thus further reducing the critical size of the transistors, and effectively improving the drive capability of the transistors.

In the transistor manufacturing process based on the HKMG technology, a source area and a drain area of a P-channel Metal Oxide Semiconductor (PMOS) device often require the formation of a germanium-silicon (SiGe) layer. In the process of depositing the SiGe layer, the insulating property of a gate oxide layer deposited on a substrate will be affected, thus affecting the electrical performance of a formed transistor device.

In view of this, the embodiments of the present disclosure provide a method for manufacturing a semiconductor device.

FIG. 1 is a flowchart of a method for manufacturing a semiconductor device provided by an embodiment of the present disclosure. As shown in FIG. 1, a method for manufacturing a semiconductor device provided by an embodiment of the present disclosure may include the following operations.

At S10, a substrate is provided, where the substrate is provided with a first device area and a second device area, and a doping type of the first device area is different from a doping type of the second device area.

At S20, a gate oxide layer which covers the first device area and the second device area is formed.

At S30, a gate conductive layer which covers the gate oxide layer is formed.

At S40, a first gate structure is formed on the first device area, where the first gate structure includes the gate conductive layer and the gate oxide layer.

At S50, a second gate structure is formed on the second device area, where the second gate structure includes the gate conductive layer and the gate oxide layer, and in the first device area and the second device area, the gate conductive layer always covers the gate oxide layer.

FIG. 2 to FIG. 14 are schematic cross-sectional views of a process of manufacturing a semiconductor device according to an embodiment of the present disclosure.

Figure 2:
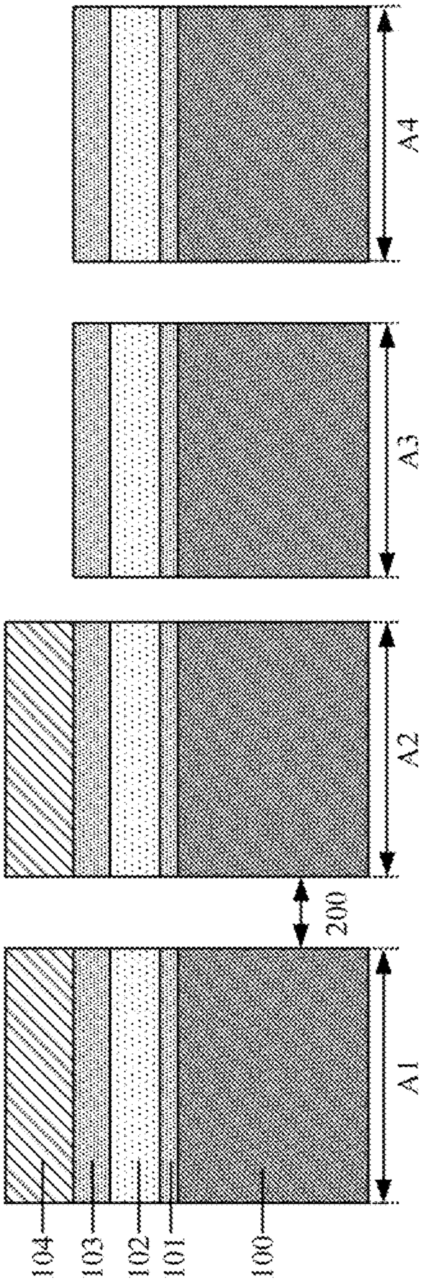
FIG. 2 to FIG. 14 are schematic cross-sectional views of a process of manufacturing a semiconductor device according to an embodiment of the present disclosure.

With reference to FIG. 2, S10 is performed. The substrate 100 may be made of semiconductor materials, such as one or more of silicon, germanium, silicon-germanium compound, and silicon-carbon compound. The substrate 100 is provided with a first device area A1 and a second device area A2. Here, as an example, the first device area A1 is a P-type device area, and the second device area A2 is an N-type device area. For example, a PMOS device is formed in the first device area A1, and an NMOS device is formed in the second device area A2.

It is to be noted that in the manufacturing of integrated circuits, a large number of active devices (such as the PMOS device and the NMOS device) are integrated on the substrate 100 simultaneously. In order to reduce the mutual effect between the devices, an isolation technology is used to isolate the active devices from each other. With reference to FIG. 2, at least one isolation area 200 is arranged on the substrate 100 to isolate the adjacent first device area A1 and second device area A2 from each other. The isolation area may include a trench isolation area or a field oxide isolation area.

It is understandable that an isolation area is also arranged on the substrate 100 to isolate the adjacent third device area A3 and fourth device area A4 from each other (not shown). The number and the position of the isolation area may be set according to the actual situation, and are not limited by the present disclosure.

With reference to FIG. 2, S20 is performed. A gate oxide layer 101 is deposited on the substrate 100. The gate oxide layer 101 may be formed in both the first device area A1 and the second device area A2. The gate oxide layer 101 protrudes from an upper surface of the substrate 100.

In the embodiments of the present disclosure, the manners by which the gate oxide layer 101 is formed on a surface of the substrate 100 include, but are not limited to, In-Situ Steam Generation (ISSG), Physical Vapor Deposition (PVD), Chemical Vapor Deposition (CVD) or Atomic Layer Deposition (ALD). Exemplarily, the material of the gate oxide layer 101 includes, but is not limited to, oxides, for example, silicon oxide.

With reference to FIG. 2, S30 is performed. The manners by which a gate conductive layer 102 is formed on a surface of the gate oxide layer 101 include, but are not limited to, PVD, CVD or ALD. Exemplarily, the material of the gate conductive layer 102 includes, but is not limited to, one or more of polycrystalline silicon, tungsten, and titanium silicon nitride.

Figure 12:
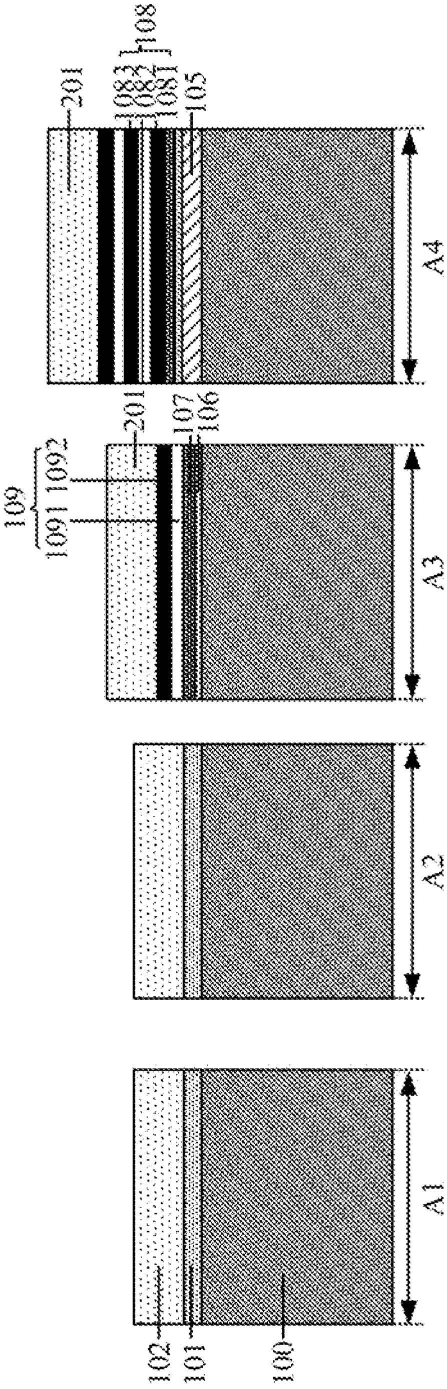
Figure 13:
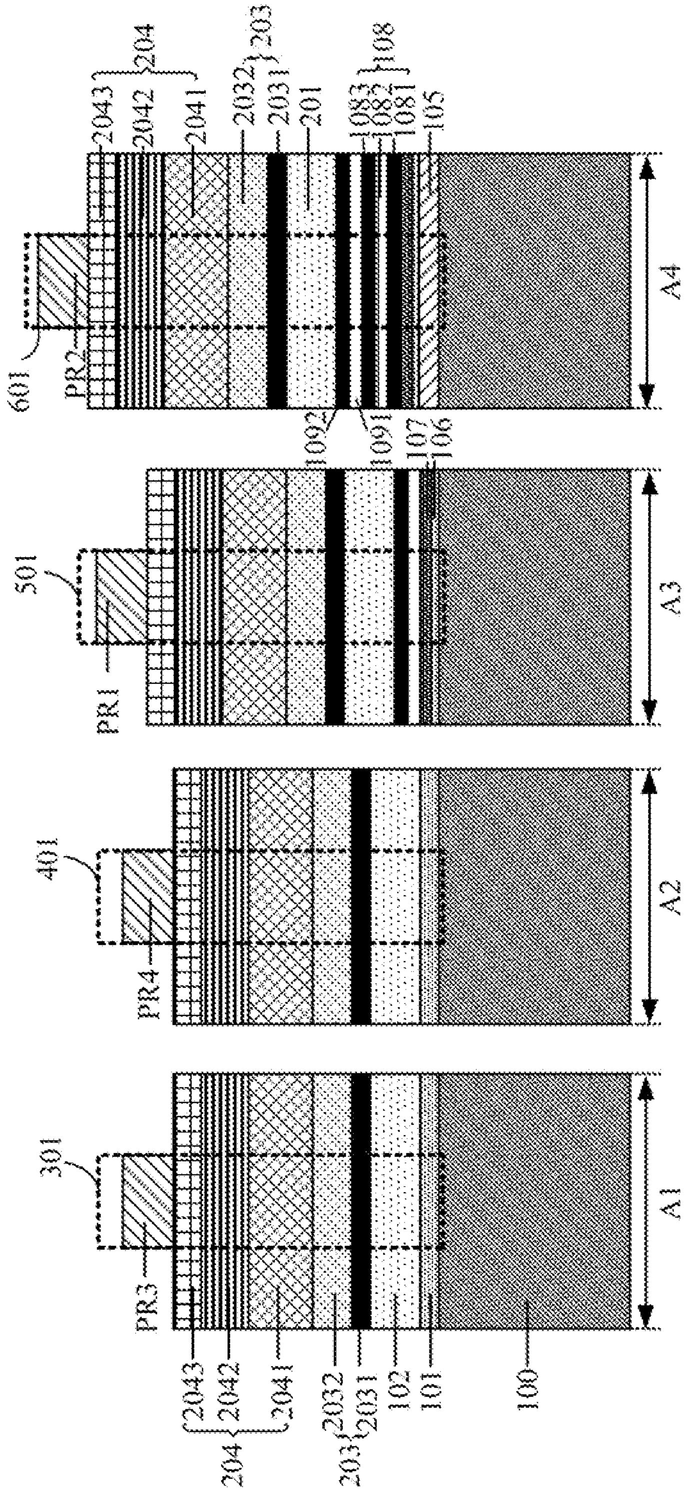
Figure 14:
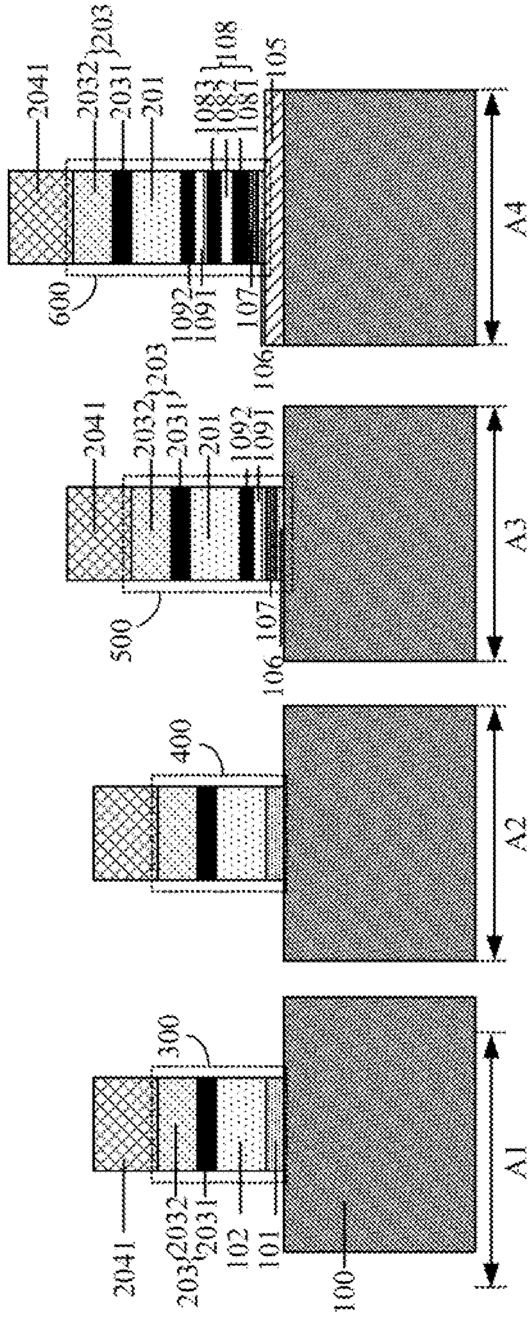

With reference to FIG. 12 to FIG. 14. S40 and S50 are performed. Here, as an example, the first gate structure has the same structure as the second gate structure. After a gate stack structure 203 is formed on the gate conductive layer 102, part of the gate stack structure 203, part of the gate conductive layer 102, and part of the gate oxide layer 101 are removed to form a first gate structure 300 located in the first device area A1 and a second gate structure 40 located in the second device area A2 (with reference to FIG. 14).

With reference to FIG. 2 to FIG. 14, in the transistor manufacturing process based on the HKMG technology, the gate conductive layer 102 always covers the surface of the gate oxide layer 101. Therefore, the gate oxide layer 101 is always protected by the gate conductive layer 102 in the process of forming the first gate structure and the second gate structure, and in the manufacturing of transistors based on the HKMG technology, the surface of the gate oxide layer 101 is effectively protected from damage, and the performance of the gate oxide layer 101 is stabilized.

It is to be noted that in the related art, after a first conductive layer which covers the gate oxide layer is formed, a second conductive layer which covers the gate oxide layer is usually formed after the first conductive layer is removed by etching. The etching process will cause damage to the gate oxide layer. Compared with solutions in the related art, in the embodiments of the present disclosure, there is no process in which the first conductive layer which covers the gate oxide layer 101 is formed, and then the second conductive layer is formed after the first conductive layer is removed, and the second conductive layer serves as the gate conductive layer. That is, in the first device area A1 and the second device area A2, the gate conductive layer 102 in the present disclosure always covers the gate oxide layer 101, so that the gate oxide layer 101 can be protected and the electrical performance of the finally formed transistor devices can be improved.

It is understandable that in the embodiments of the present disclosure, before a stack structure (for example, the gate stack structure 203) which covers the gate conductive layer 102 is formed, a gate conductive layer 102 is formed to cover the surface of the gate oxide layer 101. Further, the gate conductive layer 102 is not removed in the subsequent process (for example, in the process of forming a stack structure), but keeps covering the gate oxide layer 101. In this way, in the process of forming the first gate structure and the second gate structure, the gate oxide layer 101 is always protected by the gate conductive layer 102 from the formation of the gate conductive layer 102 to the completion of the formation of the stack structure on the gate conductive layer 102. Therefore, the gate oxide layer 101 is effectively protected, and the performance of the gate oxide layer 101 is stabilized. It is to be noted that in the embodiments of the present disclosure, the manners by which a thin film is deposited include, but are not limited to, ISSG, PVD, CVD or ALD. The removing manners include, but are not limited to, dry etching or wet etching, which will not be described in the embodiments.

In the embodiments of the present disclosure, when the first gate structure and the second gate structure are formed on the first device area and the second device area with different doping types, the gate conductive layer which covers the gate oxide layer is formed after the gate oxide layer is formed, and the first gate structure and the second gate structure are formed on the gate conductive layer. The first gate structure and the second gate structure are always in direct contact with the gate conductive layer. Therefore, in the process of forming the first gate structure and the second gate structure, the gate oxide layer is always protected by the gate conductive layer. Therefore, the damage of different deposition materials, such as silicon-germanium, to the gate oxide layer is reduced in the process of forming the gate structure, the gate oxide layer 101 is effectively protected, the performance of the gate oxide layer 101 is stabilized, which facilitate improving the electrical performance of the finally formed transistor devices, and thus improving the performance of a memory.

In some embodiments, with reference to FIG. 12 to FIG. 14, the operation that the first gate structure is formed on the first device area A1 may include the following operations.

The gate stack structure 203 which covers the gate conductive layer 102 is formed, where the gate stack structure 203 is in direct contact with the gate conductive layer 102.

Part of the gate stack structure 203, part of the gate conductive layer 102, and part of the gate oxide layer 101 are removed to form a first gate structure 300, where the first gate structure 300 is located on the first device area A1.

The operation that the second gate structure is formed on the second device area A2 may include the following operations.

The gate stack structure 203 which covers the gate conductive layer 102 is formed, where the gate stack structure 203 is in direct contact with the gate conductive layer 102.

Part of the gate stack structure 203, part of the gate conductive layer 102, and part of the gate oxide layer 101 are removed to form a second gate structure 400, where the second gate structure 400 is located on the second device area A2.

Exemplarily, with reference to FIG. 13, the gate stack structure 203 includes a fifth barrier layer 2031 and a fifth conductive layer 2032. The manners by which the fifth barrier layer 2031 and the fifth conductive layer 2032 are formed on the surface of the gate conductive layer 102 include, but are not limited to, PVD, CVD or ALD. Exemplarily, the material of the fifth barrier layer 2031 includes, but is not limited to, titanium nitride, tungsten nitride and tantalum nitride, and the material of the fifth conductive layer 2032 includes, but is not limited to, tungsten, polycrystalline silicon and titanium silicon nitride.

With reference to FIG. 13, after the gate stack structure 203 is formed, a composite mask layer 204 which covers the gate stack structure 203 is formed. Exemplarily, the composite mask layer 204 includes three film layers, such as a silicon nitride layer 2041, a Spin On Hard mask (SOH) 2042 and a silicon oxynitride layer 2043. The composite mask layer 204 with multiple layers is provided to reduce the damage of etching to the gate stack structure 203, the gate conductive layer 102 and the gate oxide layer 101 in the subsequent etching process.

The composite mask layer 204 is coated with photoresist, and then exposed and developed to obtain photoresist PR3 with mask pattern. The photoresist PR3 exposes the silicon oxynitride layer 2043 in the first device area A1 and covers the silicon oxynitride layer 2043 to be retained. The photoresist PR3 is used to define the first gate structure. In practical applications, etching to the substrate 100 is performed through the photoresist PR3, to remove part of the composite mask layer 204, part of the gate stack structure 203, part of the gate conductive layer 102 and part of the gate oxide layer 101.

With reference to FIG. 14, the SOH 2042 and the silicon oxynitride layer 2043 are removed to obtain the first gate structure protected by the silicon nitride layer 2041. The first gate structure includes the gate oxide layer 101, the gate conductive layer 102, the fifth barrier layer 2031 and the fifth conductive layer 2032. The first gate structure does not include a high dielectric material layer (HK layer with a dielectric constant greater than 3.9).

It is understandable that the first gate structure has the same structure as the second gate structure, and the second gate structure is formed while the first gate structure is formed. Refer to the above description of the first gate structure for the specific process for forming the second gate structure.

In an embodiment, the gate oxide layer, the high dielectric material layer (HK layer) and the conductive layer may be prepared successively in the first device area A1 and the second device area A2 to form an NMOS gate structure and a PMOS gate structure. However, there are a certain number of oxygen vacancies in the high dielectric material layer, and the missing oxygen will spread in other layers of the NMOS gate structure and the PMOS gate structure, resulting in the problem of reduced reliability of transistors. In the embodiments of the present disclosure, the high dielectric material layer (HK layer with a dielectric constant greater than 3.9) is not formed in the first gate structure and the second gate structure, which reduces the probability of reduced reliability of the first gate structure and the second gate structure, thus helping to improve the electrical performance of the finally formed transistor devices, and then improve the performance of a memory.

In some embodiments, the substrate is further provided with a third device area A3 and a fourth device area A4, and a doping type of the third device area A3 is different from a doping type of the fourth device area A4. The manufacturing method may further include the following operations.

The gate oxide layer 101 which covers the third device area A3 and the fourth device area A4 is formed while the gate oxide layer 101 which covers the first device area A1 and the second device area A2 is formed.

A mask layer 104 which covers the gate oxide layer 101 is formed on the third device area A3.

After the mask layer 104 is formed, the gate oxide layer 101 which covers the fourth device area A4 is removed.

After the gate oxide layer 101 which covers the fourth device area A4 is removed, a stress regulation layer 105 which covers the fourth device area is formed by selective epitaxy.

After the stress regulation layer 105 is formed, the mask layer 104 and the gate oxide layer 101 which cover the third device area A3 are removed, and a third gate structure 500 is formed on the exposed third device area A3.

A fourth gate structure 600 is formed on the stress regulation layer 105.

It is to be noted that, in the transistor manufacturing process based on the HKMG technology, it is often needed to form silicon-germanium epitaxial layers in the source area and the drain area of the PMOS device. However, in some manufacturing processes, other film layers like a gate oxide layer are deposited after the silicon-germanium epitaxial layers are formed. When the gate oxide layer is removed, the formed silicon-germanium epitaxial layers are easily damaged, resulting in the reduction of carrier mobility of the finally formed PMOS device and affecting the electrical performance of the PMOS device.

Figure 3:
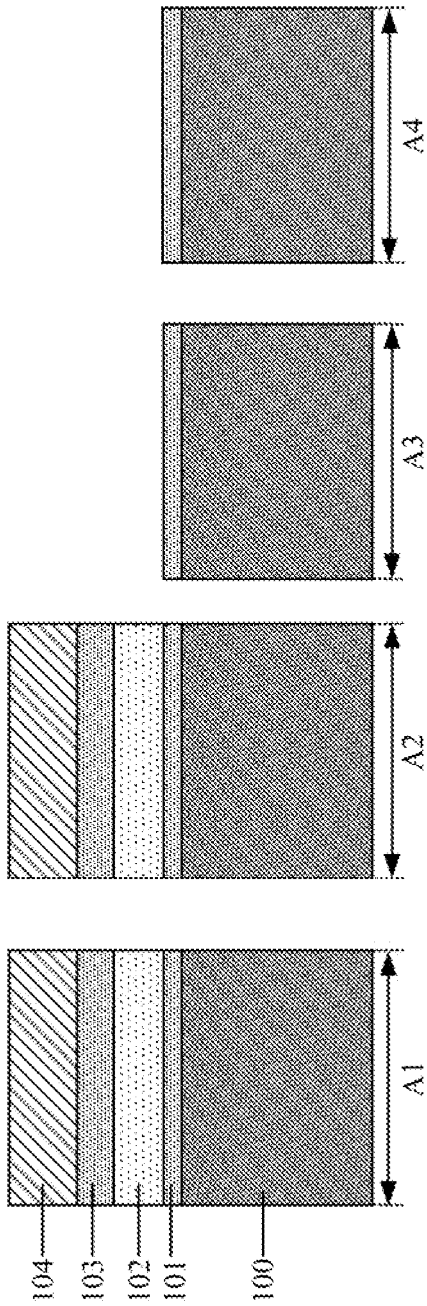

With reference to FIG. 3, the operation that the gate oxide layer 101 is deposited on the substrate 100 is performed. Specifically, the gate oxide layer 101 which covers the third device area A3 and the fourth device area A4 is formed while the gate oxide layer 101 which covers the first device area A1 and the second device area A2 is formed. Exemplarily, the thickness of the gate oxide layer 101 ranges from 4 nm to 8 nm.

Figure 7:
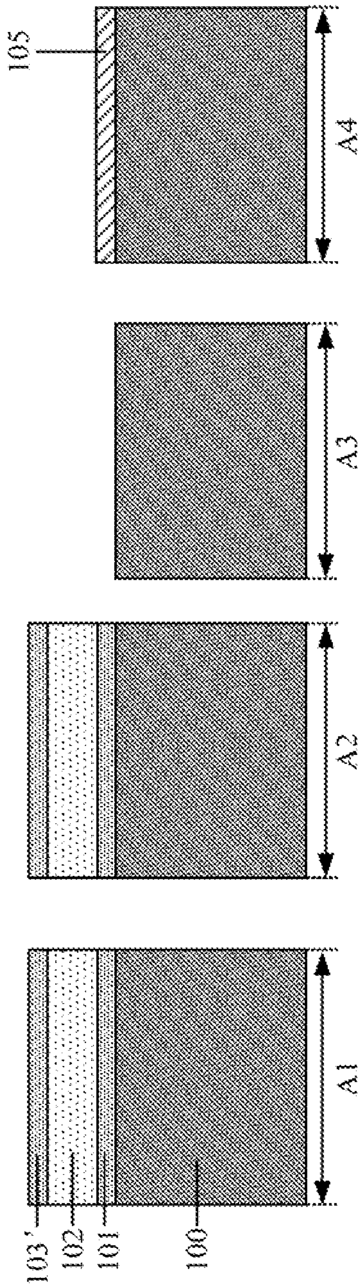
Figure 8:
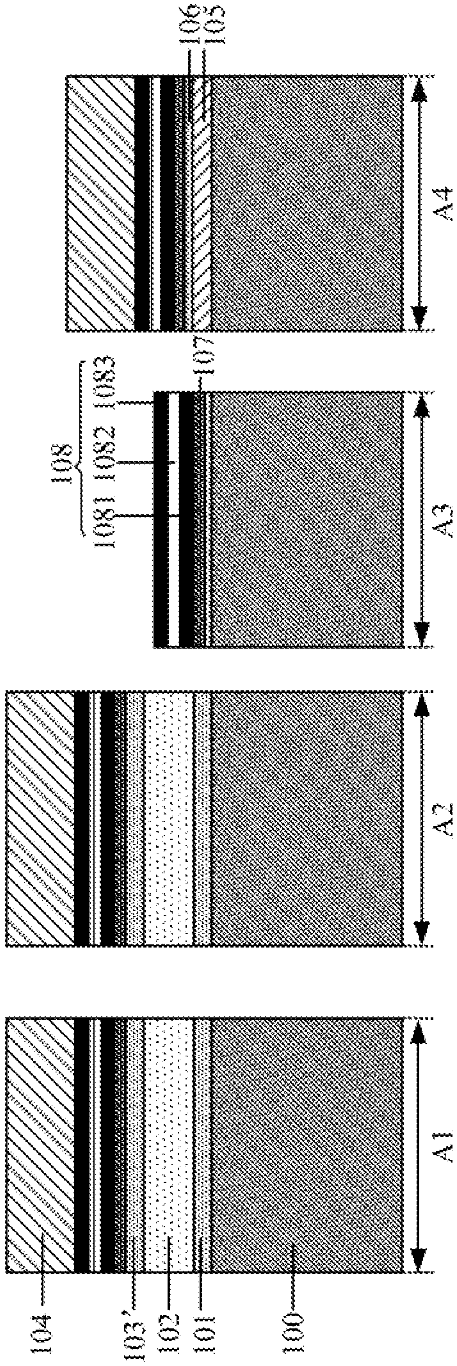

It is to be noted that each of the first device area A1 and the second device area A2 is configured to form a thick transistor, and each of the third device area A3 and the fourth device area A4 is configured to form a thin transistor. The gate oxide layer 101 which covers the third device area A3 and the fourth device area A4 is formed while the gate oxide layer 101 which covers the first device area A1 and the second device area A2 is formed. The gate oxide layer 101 is of a thick oxygen type, and the thickness of the gate oxide layer 101 ranges from 4 nm to 8 nm. With reference to FIG. 7 and FIG. 8, in order to form the thin transistors in the third device area A3 and the fourth device area A4, the gate oxide layer 101 of the thick oxygen type in the third device area A3 and the fourth device area A4 is removed, to expose the surface of the substrate in the third device area A3 and the surface of the substrate in the fourth device area A4, and a stress regulation layer is formed on the surface of the substrate in the fourth device area A4.

With reference to FIG. 8, an oxide layer 106 of a thin oxygen type is formed on the surface of the substrate in the third device area A3 and the surface of the stress regulation layer in the fourth device area A4. The oxide layer 106 serves as the gate oxide layer of a thin PMOS and a thin NMOS. The thickness of the oxide layer 106 ranges from 0.5 nm to 2 nm.

Figure 4:
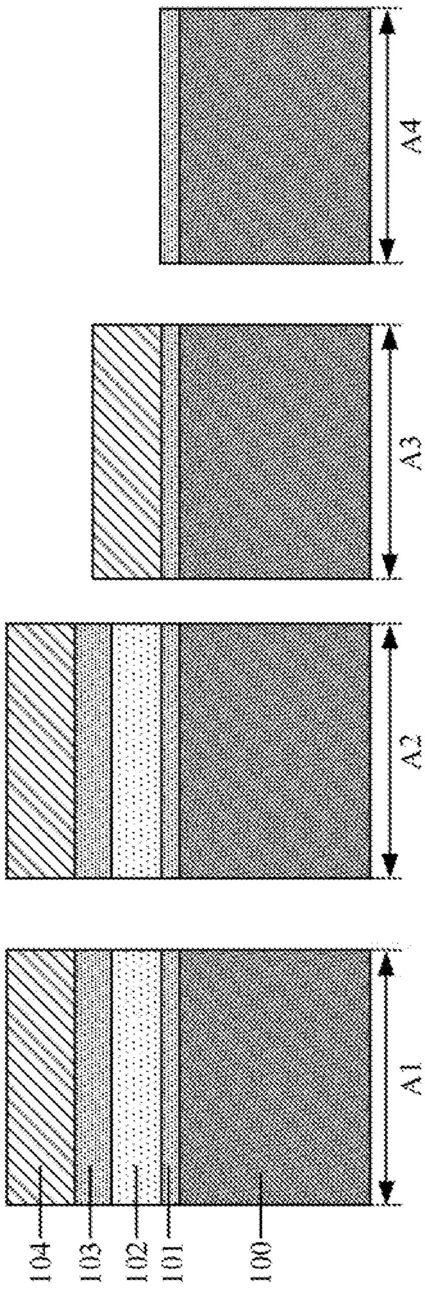
Figure 5:
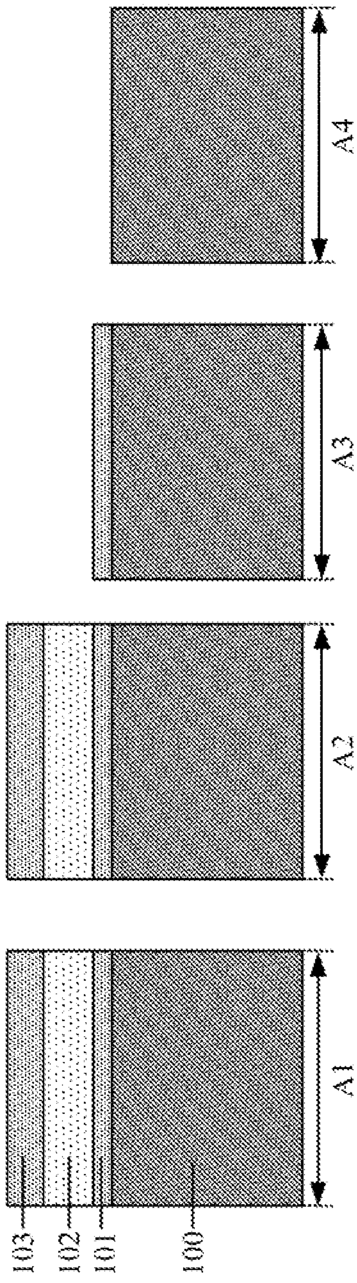
Figure 6:
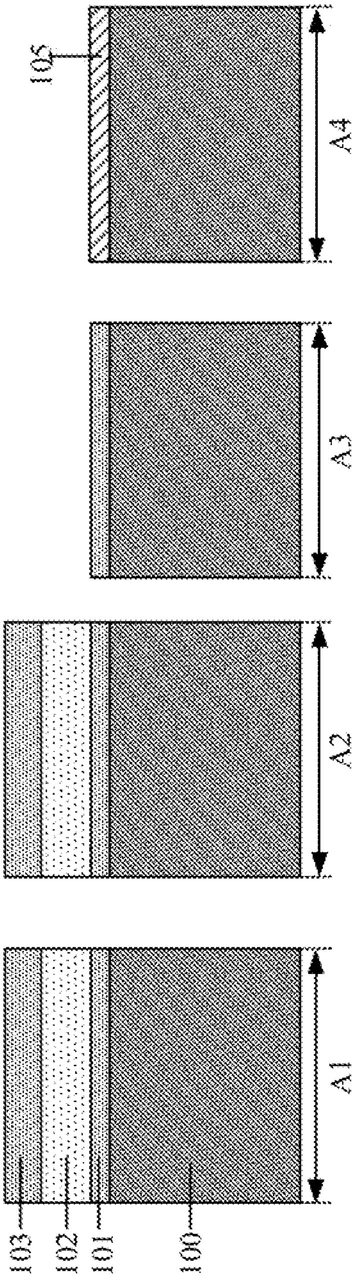

With reference to FIG. 4 to FIG. 6, After the mask layer 104 is formed in the third device area A3 to protect the gate oxide layer 101 in the third device area A3, the gate oxide layer 101 covering the fourth device area A4 is removed to expose the surface of the substrate in the fourth device area A4, and the stress regulation layer covering the fourth device area A4 is formed. With reference to FIG. 8 to FIG. 14, in the fourth device area A4 of the substrate 100, a fourth gate structure is formed on the stress regulation layer 105.

Exemplarily, the stress regulating layer 105 can be grown in the fourth device area A4 of the substrate 100 by a selective epitaxy growth technology. The above epitaxy growth technology may be understood as epitaxial growth performed in the fourth device area A4 defined on the substrate 100. Exemplarily, the material of the stress regulation layer 105 includes SiGe. The SiGe layer can regulate the stress of a channel region of the PMOS device, thus helping to improve the carrier mobility of the PMOS device, and then improve the electrical performance of the PMOS device.

With reference to FIG. 6 and FIG. 7, after the stress regulation layer 105 is formed, the mask layer 104 and the gate oxide layer 101 which cover the third device area A3 are removed to expose the surface of the substrate in the third device area A3. With reference to FIG. 8 and FIG. 14, a third gate structure is formed on the exposed third device area A3 of the substrate 100.

In the embodiments of the present disclosure, first, the gate oxide layer on the substrate is removed; after the gate oxide layer is removed, the stress regulation layer is formed on the substrate, to reduce the damage on the surface of the stress regulation layer and improve the carrier mobility of the finally formed PMOS device, thus helping to improve the electrical performance of the PMOS device and then improve the performance of a memory.

In some embodiments, the first device area A1 is a P-type device area, and the second device area A2 is an N-type device area.

In the embodiments of the present disclosure, the first device area A1 is a P-type device area, and P-type doping may be performed to the substrate 100 to form the first device area A1 of the substrate 100. The second device area A2 is an N-type device area, and N-type doping may be performed to the substrate 100 to form the second device area A2 of the substrate 100. Vice versa, elaborations are omitted herein.

In an example, the material of the substrate 100 may be silicon (Si), N-type doping ions are implanted into the first device area A1 of the substrate 100 to form the N-type doped first device area A1, and P-type doping ions are implanted into the second device area A2 of the substrate 100 to form the P-type doped second device area A2.

In some embodiments, the third device area A3 is an N-type device area, and the fourth device area A4 is a P-type device area.

In the embodiments of the present disclosure, the third device area A3 is an N-type device area, and N-type doping may be performed to the substrate 100 to form the third device area A3 of the substrate 100. The fourth device area A4 is a P-type device area, and P-type doping may be performed to the substrate 100 to form the fourth device area A4 of the substrate 100.

Here, the material of the substrate 100 may be Si, N-type doping ions are implanted into the third device area A3 of the substrate 100 to form the N-type doped third device area A3, and P-type doping ions are implanted into the fourth device area A4 of the substrate 100 to form the P-type doped fourth device area A4.

In some embodiments, the operation that a third gate structure is formed on the exposed third device area A3 may include the following operations.

An oxide layer 106, a high dielectric material layer 107 and a first gate stack layer 108 which cover the substrate 100 are formed successively.

The first gate stack layer 108 on the third device area A3 is removed.

A second gate stack layer 109 and a first conductive layer 201 which cover the high dielectric material layer 107 are formed successively.

A metal gate structure 203 which covers the first conductive layer 201 is formed.

A first mask pattern is formed on the metal gate structure 203.

Part of the metal gate structure 203, part of the first conductive layer 201, part of the second gate stack layer 109, part of the high dielectric material layer 107, and part of the oxide layer 106 are removed based on the first mask pattern to form the third gate structure 500.

It is to be noted that each of the third device area A3 and the fourth device area A4 is configured to form the thin transistors. For example, the third device area A3 is configured to form the thin NMOS, and the fourth device area A4 is configured to form the thin PMOS. Exemplarily, the oxide layer 106 serves as the gate oxide layer of the thin PMOS and the thin NMOS, and the thickness of the oxide layer 106 ranges from 0.5 nm to 2 nm.

It is understandable that with the continuous development of MOSFETs, the thickness of the gate oxide layer as the key indicator of the transistor is continuously reduced; however, the reduction of the thickness of the gate oxide layer has a limit. For example, silicon dioxide ($SiO_2$) thinned to less than 2 nm is difficult to be used as an ideal insulator due to obvious tunneling leakage.

In the embodiments of the present disclosure, with reference to FIG. 8, the oxide layer 106, the high dielectric material layer 107 and the first gate stack layer 108 are formed on the exposed third device area A3 of the substrate 100. The material of the oxide layer 106 includes $SiO_2$. The thickness of the oxide layer 106 ranges from 0.5 nm to 2 nm. Here, the oxide layer 106 whose thickness is less than or equal to 2 nm is difficult to be used as an ideal insulator, but the high performance requirements of reducing the EOT and leakage of the device can be met by forming the high dielectric material layer 107.

In some embodiments, the high dielectric material layer 107 includes a film whose dielectric constant is greater than a dielectric constant of a $SiO_2$ film. The material of the high dielectric material layer 107 includes, but is not limited to, hafnium oxide ($Hfi_2$), hafnium oxynitride (HfON), aluminium oxide ($Al_2O_3$), zirconium oxide ($ZrO_2$), hafnium silicon oxynitride (HfSiON), hafnium silicon oxide (HfSiO), zirconium silicon oxide ($ZrSiO_x$), tantalum oxide ($Ta_2O_5$), lanthanum oxide ($La_2O_3$), rare earth element oxide, rare earth element hydride and other materials.

Exemplarily, the high dielectric material layer 107 is formed on the surface of the oxide layer 106 by deposition processes. The deposition processes include, but are not limited to, CVD, plasma assisted CVD. PVD, metal-organic CVD, ALD, evaporation, reactive sputter deposition, chemical solution deposition or other similar deposition processes, or any combination of the above processes.

In the embodiments of the present disclosure, the third device area A3 is an N-type device area, and is configured to form the thin NMOS. The thickness of the oxide layer of the thin NMOS ranges from 0.5 nm to 2 nm. The first gate stack layer 108 includes a P-type work function metal layer, which is used in the P-type device. In the process of forming the N-type device in the third device area A3, an N-type work function metal layer needs to be set, and there is no need to set the P-type work function metal layer (i.e., the first gate stack layer 108). Therefore, with reference to FIG. 9, the first gate stack layer 108 in the third device area A3 is removed to expose the high dielectric material layer 107, and the second gate stack layer 109 with an N-type work function metal layer is formed on the high dielectric material layer 107.

Figure 10:
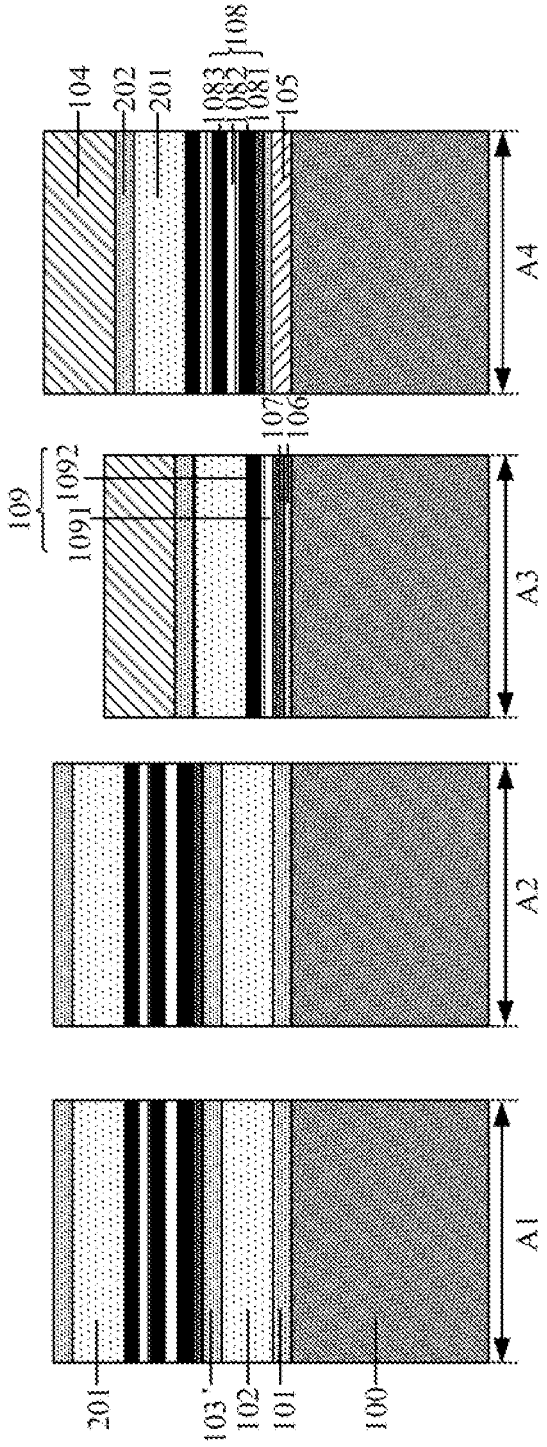

With reference to FIG. 10, after the second gate stack layer 109 and the first conductive layer 201 are formed on the high dielectric material layer 107, a third oxide layer 202 and a mask layer 104 are formed successively in the third device area A3 and the fourth device area A4. The first conductive layer 201 is made of the same material as the gate conductive layer 102, and the third oxide layer 202 is made of the same material as the gate oxide layer 101. The second gate stack layer 109 includes an N-type work function metal layer, which is configured to adjust a work function value of the third gate structure formed on the third device area A3, to control a threshold voltage of the finally formed NMOS device.

With reference to FIG. 11 to FIG. 14, in the third device area A3, a metal gate structure 203 which covers the first conductive layer 201 is formed after the third oxide layer 202 and the mask layer 104 which cover the first conductive layer 201 and which serve as a hard mask are removed. It is understandable that the metal gate structure 203 is the same as the gate stack structure 203 and can be formed in the same operation.

It is to be noted that the second oxide layer 103' in the first device area A1 and the second device area A2 is removed to expose the gate conductive layer 102 in the first device area A1 and the second device area A2 while the third oxide layer 202 and the mask layer 104 in the third device area A3 and the fourth device area A4 are removed.

With reference to FIG. 14, the metal gate structure 203 and the composite mask layer 204 are formed successively on the gate conductive layer 102 in the first device area A1 and the second device area A2, and on the first conductive layer 201 in the third device area A3 and the fourth device area A4. Exemplarily, the composite mask layer 204 includes a silicon nitride layer 2041, an SOH 2042 and a silicon oxynitride layer 2043. The composite mask layer 204 is coated with photoresist, and then exposed and developed to obtain photoresist PR1 with mask pattern. The photoresist PR1 exposes the silicon oxynitride layer 2043 in the third device area A3 and covers the silicon oxynitride layer 2043 to be retained. The photoresist PR1 is used to define the third gate structure. Etching to the substrate 100 is performed through the photoresist PR1, to remove part of the composite mask layer 204, part of the metal gate structure 203, part of the first conductive layer 201, part of the second gate stack layer 109, part of the high dielectric material layer 107, and part of the oxide layer 106.

Specifically, with reference to FIG. 13, the composite mask layer 204, the metal gate structure 203, the first conductive layer 201, the second gate stack layer 109, the high dielectric material layer 107 and the oxide layer 106 which are located outside a photoresist PR1 covered area 501 are removed by etching process, where the composite mask layer 204, the metal gate structure 203, the first conductive layer 201, the second gate stack layer 109, the high dielectric material layer 107 and the oxide layer 106 which are located in the photoresist PR1 covered area 501 are retained. With reference to FIG. 14, the SOH 2042 and the silicon oxynitride layer 2043 are removed to obtain the third gate structure protected by the silicon nitride layer 2041. The third gate structure includes the oxide layer 106, the high dielectric material layer 107, the second gate stack layer 109, the first conductive layer 201 and the metal gate structure 203.

In the embodiments of the present disclosure, by using the HKMG technology to form the third gate structure of the thin NMOS, the EOT and leakage of the device can be reduced, the electrical performance of the finally formed NMOS device can be improved, and then the performance of a memory can be improved.

In some embodiments, the operation that a fourth gate structure is formed on the stress regulation layer 105 may include the following operations.

The oxide layer 106, the high dielectric material layer 107 and the first gate stack layer 108 which cover the stress regulation layer 105 are formed successively.

The second gate stack layer 109 and the First conductive layer 201 which cover the first gate stack layer 108 are formed.

The metal gate structure 203 which covers the first conductive layer 201 is formed.

A second mask pattern is formed on the metal gate structure 203.

Part of the metal gate structure 203, part of the first conductive layer 201, part of the second gate stack layer 109, part of the first gate stack layer 108, part of the high dielectric material layer 107, and part of the oxide layer 106 are removed based on the second mask pattern to form the fourth gate structure 600.

With reference to FIG. 8 to FIG. 14, the oxide layer 106, the high dielectric material layer 107, the first gate stack layer 108, the second gate stack layer 109, the first conductive layer 201, and the metal gate structure 203 are formed successively on the stress regulation layer 105. The oxide layer 106, the high dielectric material layer 107, the second gate stack layer 109, the first conductive layer 201 and the metal gate structure 203 can refer to the relevant description in the embodiment of the third gate structure, and elaborations are omitted herein.

In the embodiments of the present disclosure, the fourth device area A4 is an area where a P-type device, for example, the thin PMOS is formed. The thickness of the oxide layer 106 of the thin PMOS ranges from 0.5 nm to 2 nm. In an embodiment, the fourth gate structure includes the first gate stack layer 108 and the second gate stack layer 10), the first gate stack layer 108 includes the P-type work function metal layer, and the second gate stack layer 109 includes the N-type work function metal layer. By setting different gate stack layer materials, performance parameters of the subsequent PMOS device including the fourth gate structure can be controllable. The threshold voltage of the PMOS device can be fully controlled by setting and adjusting the work function values of the gate stack layer materials.

With reference to FIG. 11 to FIG. 14, in the fourth device area A4, the metal gate structure 203 and the composite mask layer 204 which cover the first conductive layer 201 are formed after the third oxide layer 202 and the mask layer 104 which cover the first conductive layer 201 and which serve as the hard mask are removed. Here, the composite mask layer 204 includes the silicon nitride layer 2041, the SOH 2042 and the silicon oxynitride layer 2043. The composite mask layer 204 is coated with photoresist, and then exposed and developed to obtain photoresist PR2 with mask pattern. The photoresist PR2 exposes the silicon oxynitride layer 2043 in the fourth device area A4 and covers the silicon oxynitride layer 2043 to be retained. The photoresist PR2 is used to define the fourth gate structure. Etching to the stress regulation layer 105 is performed through the photoresist PR2, to remove part of the composite mask layer 204, part of the metal gate structure 203, part of the first conductive layer 201, part of the second gate stack layer 109, part of the first gate stack layer 108, part of the high dielectric material layer 107, and part of the oxide layer 106.

Specifically, with reference to FIG. 13, the composite mask layer 204, the metal gate structure 203, the first conductive layer 201, the second gate stack layer 109, the first gate stack layer 108, the high dielectric material layer 107 and the oxide layer 106 which are located outside a photoresist PR2 covered area 601 are removed by etching process, where the composite mask layer 204, the metal gate structure 203, the first conductive layer 201, the second gate stack layer 109, the first gate stack layer 108, the high dielectric material layer 107 and the oxide layer 106 which are located in the photoresist PR2 covered area 601 are retained.

With reference to FIG. 14, the SOH 2042 and the silicon oxynitride layer 2043 are removed to obtain the fourth gate structure protected by the silicon nitride layer 2041. Here, the fourth gate structure includes the oxide layer 106, the high dielectric material layer 107, the first gate stack layer 108, the second gate stack layer 109, the first conductive layer 201 and the metal gate structure 203.

In the embodiments of the present disclosure, by using the HKMG technology to form the fourth gate structure of the thin PMOS, the EOT and leakage of the device can be reduced, and the electrical performance of the finally formed NMOS device can be improved. Moreover, the fourth gate structure is formed on the stress regulation layer. The stress regulation layer can improve the carrier mobility of the finally formed PMOS device, thus helping to further improve the electrical performance of the PMOS device, and then improve the performance of a memory.

In some embodiments, the operation that the oxide layer 106, the high dielectric material layer 107 and the first gate stack layer 108 are formed may include the following operations.

The oxide layer 106 and the high dielectric material layer 107 are deposited successively.

A first barrier layer 1081, a second conductive layer 1082, and a second barrier layer 1083 which cover the high dielectric material layer 107 are formed to form the first gate stack layer 108.

With reference to FIG. 8, the oxide layer 106, the high dielectric material layer 107 and the first gate stack layer 108 are formed successively on the stress regulation layer 105. In practical applications, the first gate stack layer 108 may include the first barrier layer 1081, the second conductive layer 1082, and the second barrier layer 1083.

Exemplarily, the material of the first barrier layer 1081 and the material of the second barrier layer 1083 include, but are not limited to, titanium nitride (TiN), the material of the second conductive layer 1082 includes, but is not limited to, P-type work function metals or metal oxides, such as aluminium oxide ($Al_2O_3$), magnesium oxide (MgO), calcium oxide (CaO) or a mixture thereof. In the embodiment, the material of the second conductive layer 1082 includes aluminium oxide ($Al_2O_3$).

In the embodiments of the present disclosure, the first gate stack layer 108 includes the P-type work function metal or metal oxide for adjusting the work function of the P-type semiconductor structure to reduce the occurrence of Fermi energy level pinning, and by setting different gate stack materials in the first gate stack layer 108, the performance parameters of the subsequent P-type transistor device can be controllable, the electrical performance of the P-type transistor can be stabilized, and then the performance of a memory can be improved.

In some embodiments, the operation that the second gate stack layer 109 and the first conductive layer 201 are formed may include the following operations.

A third conductive layer 1091 and a third barrier layer 1092 are deposited successively to form the second gate stack layer 109.

The first conductive layer 201 which covers the second gate stack layer 10) is formed.

Figure 9:
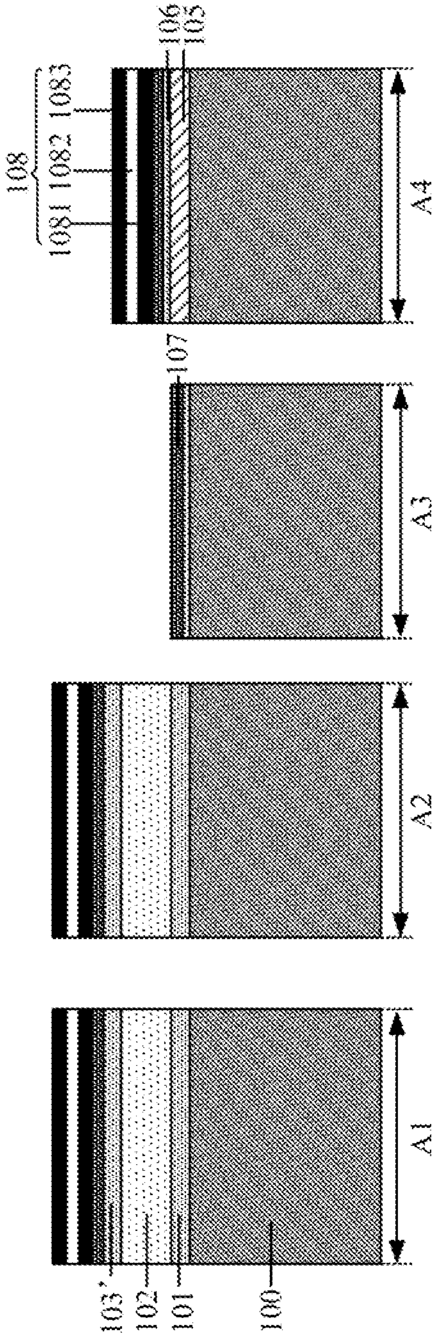

With reference to FIG. 9 and FIG. 10, the second gate stack layer 109 is formed on the first gate stack layer 108. In practical applications, the second gate stack layer 109 includes the third conductive layer 1091 and the third barrier layer 1092.

Exemplarily, the material of the third barrier layer 1092 includes, but is not limited to, titanium nitride (TiN), the material of the third conductive layer 1091 includes, but os not limited to, N-type work function metals or metal oxides, such as lanthanum oxide ($La_2O_3$), scandium oxide ($Sc_2O_3$), yttrium oxide ($Y_2O_3$), tantalum oxide ($Ta_2O_5$), titanium oxide ($TiO_2$), zirconium oxide ($ZrO_2$) or a mixture thereof.

In the embodiment, the material of the third conductive layer 1091 includes lanthanum oxide ($La_2O_3$).

In the embodiments of the present disclosure, the second gate stack layer 109 is configured for adjusting the work function of the N-type semiconductor structure to reduce the occurrence of Fermi energy level pinning, and by setting different gate stack materials in the second gate stack layer 109, the performance parameters of the subsequent N-type transistor device can be controllable, the electrical performance of the N-type transistor can be stabilized, and then the performance of a memory can be improved.

In some embodiments, the operation that the metal gate structure 203 which covers the first conductive layer 201 is formed may include the following operation.

A fourth barrier layer 2031 and a fourth conductive layer 2032 which cover the first conductive layer 201 are formed successively to form the metal gate structure 203.

With reference to FIG. 13, the metal gate structure 203 includes the fourth barrier layer 2031 and the fourth conductive layer 2032. The material of the fourth barrier layer 2031 includes, but is not limited to, titanium nitride, and the material of the fourth conductive layer 2032 includes, but is not limited to, tungsten.

The manners by which the fourth barrier layer 2031 and the fourth conductive layer 2032 are formed on the surface of the first conductive layer 201 include, but are not limited to, PVD, CVD or ALD.

In the embodiments of the present disclosure, the HKMG technology is used to obtain a gate structure by combining the high dielectric material layer with the metal gate structure. The gate structure prepared in this way can reduce the EOT and leakage of the device, improve the electrical performance of the finally formed transistor device, and then improve the performance of a memory.

In some embodiments, the gate conductive layer 102 includes a polycrystalline silicon layer 102, and the gate stack structure 203 includes a fifth barrier layer 2031 and a fifth conductive layer 2032.

The operation that the gate stack structure 203 which covers the gate conductive layer 102 is formed may include the following operations.

The fifth barrier layer 2031 which covers the polycrystalline silicon layer 102 is formed.

The fifth conductive layer 2032 which covers the fifth barrier layer 2031 is formed.

With reference to FIG. 13, the gate conductive layer 102 includes the polycrystalline silicon layer 102, the gate stack structure 203 is the same as the metal gate structure 203, and the gate stack structure 203 includes the fifth barrier layer 2031 and the fifth conductive layer 2032. In an example, the fifth barrier layer 2031 is the same as the fourth barrier layer 2031, and the fifth conductive layer 2032 is the same as the fourth conductive layer 2032. Exemplarily, the material of the fifth barrier layer 2031 includes, but is not limited to, titanium nitride, and the material of the fifth conductive layer 2032 includes, but is not limited to, tungsten.

Exemplarily, the polycrystalline silicon layer 102 can be formed by CVD using precursor silane ($SiH_4$) or other silicon-based precursors.

It is to be noted that in order to reduce process operations and reduce process costs, the fifth barrier layer 2031 and the fourth barrier layer 2031 can be formed in the same operation, and the fifth conductive layer 2032 and the fourth conductive layer 2032 can be formed in the same operation.

With reference to FIG. 14, after the gate stack structure 203 is formed, the composite mask layer 204 which covers the gate stack structure 203 is formed. Here, the composite mask layer 204 includes the silicon nitride layer 2041, the SOH 2042 and the silicon oxynitride layer 2043. The composite mask layer 204 is coated with photoresist, and then exposed and developed to obtain photoresist PR3 with mask pattern. The photoresist PR3 exposes the silicon oxynitride layer 2043 in the first device area A1 and covers the silicon oxynitride layer 2043 to be retained. The photoresist PR3 is used to define the first gate structure. Etching to the substrate 100 is performed through the photoresist PR3, to remove part of the composite mask layer 204, part of the gate stack structure 203, part of the gate conductive layer 102 and part of the gate oxide layer 101.

Specifically, with reference to FIG. 13, the composite mask layer 204, the gate stack structure 203, the gate conductive layer 102 and the gate oxide layer 101 which are located outside a photoresist PR3 covered area 301 are removed by etching process, where the composite mask layer 204, the gate stack structure 203, the gate conductive layer 102 and the gate oxide layer 101 which are located in the photoresist PR3 covered area 301 are retained.

With reference to FIG. 14, the SOH 2042 and the silicon oxynitride layer 2043 are removed to obtain the first gate structure 300 protected by the silicon nitride layer 2041. The first gate structure 300 includes the gate oxide layer 101, the gate conductive layer 102, the fifth barrier layer 2031 and the fifth conductive layer 2032. The first gate structure 30M does not include the high dielectric material layer (HK layer with a dielectric constant greater than 3.9).

It is understandable that with reference to FIG. 13, the composite mask layer 204 is coated with photoresist, and then exposed and developed to obtain photoresist PR4 with mask pattern. The photoresist PR4 exposes the silicon oxynitride layer 2043 in the second device area A2 and covers the silicon oxynitride layer 2043 to be retained. The photoresist PR4 is used to define the second gate structure. The first gate structure has the same structure as the second gate structure, and the second gate structure is formed while the first gate structure is formed. Refer to the above description of the first gate structure for the specific process for forming the second gate structure.

Specifically, with reference to FIG. 13, the composite mask layer 204, the gate stack structure 203, the gate conductive layer 102 and the gate oxide layer 101 which are located outside a photoresist PR4 covered area 401 are removed by etching process, where the composite mask layer 204, the gate stack structure 203, the gate conductive layer 102 and the gate oxide layer 101 which are located in the photoresist PR4 covered area 401 are retained.

The missing oxygen in the high dielectric material layer will cause the electric leakage of a device, thus the reliability of the device cannot be guaranteed. In the embodiments of the present disclosure, each of the first gate structure and the second gate structure includes the barrier layer (titanium nitride) and the conductive layer (tungsten), and the high dielectric material layer (HK layer with a dielectric constant greater than 3.9) is not formed, which reduces the probability of reduced reliability of the first gate structure and the second gate structure, thus helping to improve the electrical performance of the finally formed transistor devices, and then improve the performance of a memory.

In some embodiments, before the fifth barrier layer 2031 which covers the polycrystalline silicon layer 102 is formed, the method may further include the following operations.

The first oxide layer 103 which covers the polycrystalline silicon layer 102 is formed.

Part of the first oxide layer 103 is removed to form the second oxide layer 103'.

The high dielectric material layer 107 and the first gate stack layer 108 which cover the second oxide layer 103' are formed.

The second gate stack layer 109 and the first conductive layer 201 which cover the first gate stack layer 108 are formed.

The first conductive layer 201, the second gate stack layer 109, the first gate stack layer 108, the high dielectric material layer 107 and the second oxide layer 103' are removed to expose the polycrystalline silicon layer 102.

With reference to FIG. 2 to FIG. 4, the gate oxide layer 101, the gate conductive layer 102 and the first oxide layer 103 as a hard mask are deposited successively on the first device area A1 and the second device area A2 of the substrate 100, and the mask layer 104 is formed on the first oxide layer 103. The first oxide layer 103 is made of the same material as the gate oxide layer 101, for example, silicon dioxide. The thickness of the first oxide layer 103 is greater than the thickness of the gate oxide layer 101.

With reference to FIG. 5 to FIG. 7, the mask layer 104 on the first device area A1 and the second device area A2 are removed. When the third device area A3 and the fourth device area A4 are processed, there is the first oxide layer 103 as a hard mask in the first device area A1 and the second device area A2, so that the first oxide layer 103 can reduce the damage to the film layers in first device area A1 and the second device area A2.

With reference to FIG. 5, the gate oxide layer 101 in the fourth device area A4 can be removed after a protective layer (not shown) is formed on the gate oxide layer 101 in the third device area A3. With reference to FIG. 6, the stress regulation layer 105 is selectively deposited on the fourth device area A4.

With reference to FIG. 7, when the gate oxide layer 101 in the third device area A3 is removed, part of the first oxide layer 103 in the first device area A1 and the second device area A2 is removed since the thickness of the first oxide layer 103 is greater than the thickness of the gate oxide layer 101. The remaining part of the first oxide layer 103 after part of the first oxide layer 103 is removed forms the second oxide layer 103'.

Figure 11:
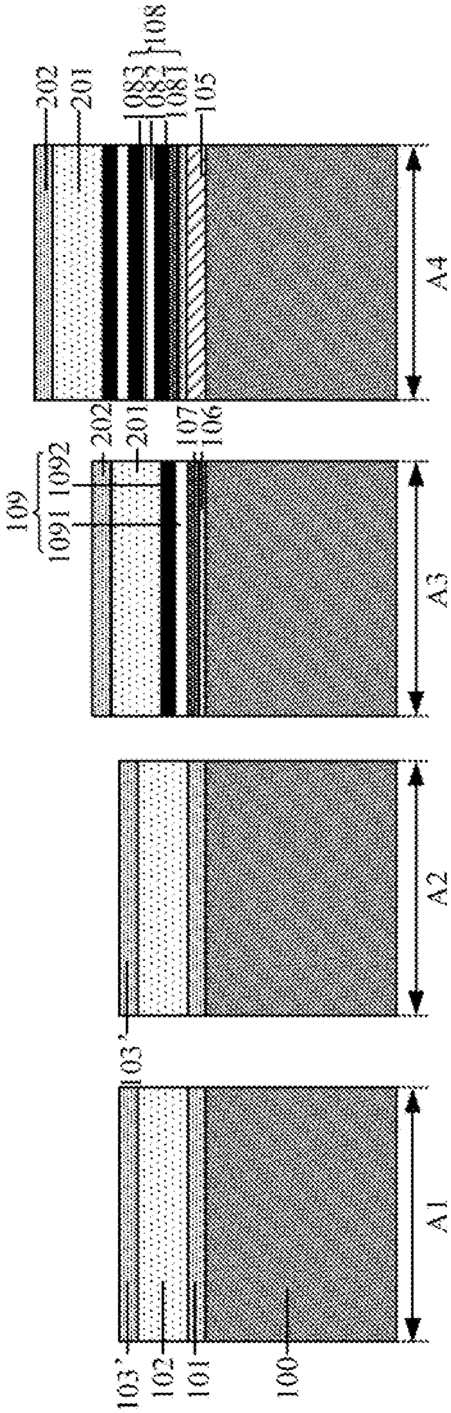

With reference to FIG. 8 to FIG. 10, when the high dielectric material layer, the first gate stack layer, the second gate stack layer and the first conductive layer are formed on the third device area A3 and the fourth device area A4, the corresponding film layers are also formed on the second oxide layer 103' in the first device area A1 and the second device area A2. With reference to FIG. 11, the film layers on the second oxide layer 103' are removed.

With reference to FIG. 12, after the second oxide layer 103' for protection is removed, the polycrystalline silicon layer 102 is exposed, so that the first gate structure in the first device area A1 and the second gate structure in the second device area A2 are formed on the polycrystalline silicon layer 102 in multiple operations.

In the embodiments of the present disclosure, the first device area A1 and the second device area A2 are processed while the third device area A3 and the fourth device area A4 are processed, which improves the compatibility of the transistor manufacturing process, helps to improve the manufacturing efficiency of transistor devices, and thus reduces the manufacturing cost.

It is to be understood that the operations in the method for manufacturing a semiconductor device may not necessarily be performed exactly in order: instead, the operations may be performed in any sequence or at the same time. Moreover, other operations may also be added in these processes.

The embodiments of the present disclosure also provide a semiconductor device. FIG. 14 is a schematic cross-sectional view of a semiconductor device provided by the embodiments of the present disclosure. As shown in FIG. 14, the semiconductor device includes: a substrate, a gate oxide layer, a gate conductive layer, a first gate structure, and a second gate structure.

The substrate 100 is provided with the first device area A1 and the second device area A2. A doping type of the first device area A1 is different from a doping type of the second device area A2.

The gate oxide layer 101 is located on the first device area A1 and the second device area A2.

The gate conductive layer 102 is located on the gate oxide layer 101.

The first gate structure includes the gate conductive layer 102 and the gate oxide layer 101. The first gate structure is located on the first device area A1.

The second gate structure includes the gate conductive layer 102 and the gate oxide layer 101. The second gate structure is located on the second device area A2.

In an example, there are a certain number of oxygen vacancies in the high dielectric material layer, and the missing oxygen will spread in other layers of the NMOS gate structure and the PMOS gate structure, resulting in the problem of reduced reliability of transistors. In the embodiments of the present disclosure, the high dielectric material layer (HK layer with a dielectric constant greater than 3.9) is not formed in the first gate structure and the second gate structure, which reduces the probability of reduced reliability of the first gate structure and the second gate structure, thus helping to improve the electrical performance of the finally formed transistor devices, and then improve the performance of a memory.

In some embodiments, with reference to FIG. 14, the gate conductive layer 102 includes the polycrystalline silicon layer 102, and the first gate structure and the second gate structure also include the gate stack structure 203.

The polycrystalline silicon layer 102 is located on the gate oxide layer 101. The polycrystalline silicon layer 102 is in direct contact with the gate oxide layer 101.

The gate stack structure 203 is located on the polycrystalline silicon layer 102. The gate stack structure 203 is in direct contact with the polycrystalline silicon layer 102.

In the embodiments of the present disclosure, the HKMG technology is used to obtain a gate structure by combining the high dielectric material layer with the metal gate structure. The gate structure prepared in this way can reduce the EOT and leakage of the device, improve the electrical performance of the finally formed transistor device, and then improve the performance of a memory.

In some embodiments, with reference to FIG. 14, the substrate 100 is further provided with the third device area A3 and the fourth device area A4. A doping type of the third device area A3 is different from a doping type of the fourth device area A4.

The third gate structure is located on the third device area A3 of the substrate 100, and includes the oxide layer 106 and the high dielectric material layer 107. The oxide layer 106 is in direct contact with the substrate 100, and the high dielectric material layer 107 is in direct contact with the oxide layer 106.

The stress regulation layer 105 is located on the fourth device area A4 of the substrate. The stress regulation layer 105 is in direct contact with the surface of the substrate 1).

The fourth gate structure is located on the stress regulation layer 105, and includes the oxide layer 106 and the high dielectric material layer 107. The oxide layer 106 is in direct contact with the stress regulation layer 105, and the high dielectric material layer 107 is in direct contact with the oxide layer 106.

Exemplarily, the material of the stress regulation layer 105 includes SiGe. The SiGe layer can regulate the stress of a channel region of the PMOS device, thus helping to improve the carrier mobility of the PMOS device, and then improve the electrical performance of the PMOS device.

In the embodiments of the present disclosure, the HKMG technology is used to form the third gate structure and the fourth gate structure, which can reduce the EOT and leakage of the device, improve the electrical performance of the finally formed transistor device, and then improve the performance of a memory. Moreover, the fourth gate structure is located on the stress regulation layer. The stress regulation layer can improve the carrier mobility of the finally formed PMOS device, thus helping to further improve the electrical performance of the PMOS device.

In some embodiments, with reference to FIG. 14, the thickness of the gate oxide layer 101 in the first device area A1 and the second device area A2 is greater than the thickness of the oxide layer 106 in the third device area A3 and the fourth device area A4.

It is to be noted that the first device area A1 and the second device area A2 are configured to form the thick transistor, and the third device area A3 and the fourth device area A4 configured to form the thin transistor.

With reference to FIG. 14, the gate oxide layer 101 in the first device area A1 and the second device area A2 is of a thick oxygen type. The oxide layer 106 in the third device area A3 and the fourth device area A4 is of a thin oxygen type. The oxide layer 106 serves as the gate oxide layer of the thin transistor formed in the third device area A3 and the fourth device area A4. Therefore, the thickness of the gate oxide layer 101 in the first device area A1 and the second device area A2 is greater than the thickness of the oxide layer 106 in the third device area A3 and the fourth device area A4.

In an embodiment, the thickness of the gate oxide layer 101 in a direction perpendicular to the substrate ranges from 4 nm to 8 nm.

In an example, the first device area A1 is an N-type device area, and is configured to form the thick NMOS. The thickness of the oxide layer of the thick NMOS ranges from 4 nm to 8 nm. The second device area A2 is a P-type device area, and is configured to form the thick PMOS. The thickness of the oxide layer of the thick PMOS ranges from 4 am to 8 nm.

In another example, the first device area A1 is a P-type device area, and can be configured to form the thick PMOS. The thickness of the oxide layer of the thick PMOS ranges from 4 nm to 8 nm. The second device area A2 is an N-type device area, and can be configured to form the thick NMOS. The thickness of the oxide layer of the thick NMOS ranges from 4 nm to 8 nm.

In an embodiment, the thickness of the oxide layer 106 in the direction perpendicular to the substrate ranges from 0.5 nm to 2 nm.

In the embodiments of the present disclosure, the third device area A3 is an N-type device area, and is configured to form the thin NMOS. Here, the thickness of the oxide layer 106 of the thin NMOS ranges from 0.5 nm to 2 nm. The fourth device area A4 is a P-type device area, and is configured to form the thin PMOS. The thickness of the oxide layer of the thin PMOS ranges from 0.5 nm to 2 am.

The embodiments of the present disclosure also provide a memory, which includes: a storage cell and a control circuit coupled to the storage cell.

The storage cell is configured to store data.

The control circuit is configured to control the storage cell to perform a read or write operation. The control circuit includes the semiconductor device described in the above embodiments.

In the development of a Dynamic Random Access Memory (DRAM), the HKMG technology can be applied in a periphery control circuit area, to meet the high performance requirements of reducing the EOT and leakage of the device.

In an embodiment, the control circuit includes the semiconductor device in the above embodiments. The semiconductor device includes a first transistor and a second transistor. The first transistor includes a first gate structure, and the second transistor includes a second gate structure. The semiconductor device further includes a third transistor and a fourth transistor. The third transistor includes a third gate structure, and the fourth transistor includes a fourth gate structure.

The first device area A1 is provided with the first transistor (thick PMOS), the second device area A2 is provided with the second transistor (thick NMOS), the third device area A3 is provided with the third transistor (thin NMOS), the fourth device area A4 is provided with the fourth transistor (thin PMOS).

It is to be noted that the periphery control circuit area includes a variety of device areas, and the variety of device areas include a variety of N-type and P-type FETs. For example, the periphery control circuit area includes an N-type FET core area, an Input/Output (IO) N-type transistor area, a P-type FET core area, and an IO P-type transistor area. In the embodiment, the first transistor (thick PMOS) may be set in the IO P-type transistor area, the second transistor (thick NMOS) may be set in the IO N-type transistor area, the third transistor (thin NMOS) may be set in the N-type FET core area, and the fourth transistor (thin PMOS) may be set in the P-type FET core area.

In some embodiments, the storage cell may include:

a transistor and a charge storage coupled to the transistor.

Here, the DRAM is taken as an example. Generally, the storage cell of the DRAM includes one transistor and one charge storage. The charge storage is configured to store the written data.

It is to be noted that common memories are listed here only as examples, and the scope of the present disclosure is not limited to this. Any memory including the semiconductor device provided by the embodiments of the present disclosure falls within the scope of protection of the present disclosure.

The above is only the specific implementation modes of the present disclosure and not intended to limit the protection scope of the present disclosure; any change or replacement that those skilled in the art can think of easily in the scope of technologies disclosed by the present disclosure shall fall within the scope of protection of the present disclosure.

The invention claimed is:

1. A method for manufacturing a semiconductor device, comprising:

providing a substrate, wherein the substrate is provided with a first device area, a second device area, a third device area and a fourth device area, and a doping type of the first device area is different from a doping type of the second device area, a doping type of the third device area is different from a doping type of the fourth device area;

forming a gate oxide layer which covers the first device area, the second device area, the third device area and the fourth device area;

forming, on the third device area, a mask layer which covers the gate oxide layer;

removing the gate oxide layer which covers the fourth device area after the mask layer is formed;

forming a stress regulation layer which covers the fourth device area by selective epitaxy after the gate oxide layer which covers the fourth device area is removed;

removing the mask layer and the gate oxide layer which cover the third device area;

forming a gate conductive layer which covers the gate oxide layer;

forming a first gate structure on the first device area, wherein the first gate structure comprises the gate conductive layer and the gate oxide layer, including: forming a stack structure which covers the gate conductive layer, wherein the stack structure is in direct contact with the gate conductive layer; and removing part of the stack structure, part of the gate conductive layer, and part of the gate oxide layer to form the first gate structure, wherein the first gate structure is located on the first device area;

forming a second gate structure on the second device area, wherein the second gate structure comprises the gate conductive layer and the gate oxide layer; and wherein in the first device area and the second device area, the gate conductive layer covers the gate oxide layer, including forming the stack structure which covers the gate conductive layer, wherein the stack structure is in direct contact with the gate conductive layer; and removing part of the stack structure, part of the gate conductive layer, and part of the gate oxide layer to form the second gate structure, wherein the second gate structure is located on the second device area; and wherein the gate conductive layer comprises a polycrystalline silicon layer, and the stack structure comprises a first barrier layer and a first conductive layer; wherein forming the stack structure which covers the gate conductive layer comprises: forming the first barrier layer which covers the polycrystalline silicon layer; and forming the first conductive layer which covers the first barrier layer;

forming a third gate structure on the third device area being exposed; and forming a fourth gate structure on the stress regulation layer.

2. The method for manufacturing the semiconductor device of claim 1, wherein the first device area is a P-type device area, and the second device area is an N-type device area.

3. The method for manufacturing the semiconductor device of claim 1, wherein the third device area is an N-type device area, and the fourth device area is a P-type device area.

4. The method for manufacturing the semiconductor device of claim 1, wherein forming the third gate structure on the exposed third device area comprises:

forming successively an oxide layer, a high dielectric material layer and a first gate stack layer which cover the substrate;

removing the first gate stack layer in the third device area;

forming successively a second gate stack layer and a second conductive layer which cover the high dielectric material layer;

forming a metal gate structure which covers the second conductive layer;

forming a first mask pattern on the metal gate structure; and removing part of the metal gate structure, part of the second conductive layer, part of the second gate stack layer, part of the high dielectric material layer, and part of the oxide layer based on the first mask pattern to form the third gate structure.

5. The method for manufacturing the semiconductor device of claim 4, wherein forming the oxide layer, the high dielectric material layer and the first gate stack layer comprises:

depositing the oxide layer and the high dielectric material layer successively; and forming a second barrier layer, a third conductive layer, and a third barrier layer which cover the high dielectric material layer to form the first gate stack layer.

6. The method for manufacturing the semiconductor device of claim 4, wherein forming the second gate stack layer and the second conductive layer comprises:

depositing a fourth conductive layer and a fourth barrier layer successively to form the second gate stack layer; and forming the second conductive layer which covers the second gate stack layer.

7. The method for manufacturing the semiconductor device of claim 4, wherein forming the metal gate structure which covers the second conductive layer comprises:

successively forming a fifth barrier layer and a fifth conductive layer which cover the second conductive layer to form the metal gate structure.

8. The method for manufacturing the semiconductor device of claim 1, wherein forming the fourth gate structure on the stress regulation layer comprises:

forming successively an oxide layer, a high dielectric material layer and a first gate stack layer which cover the stress regulation layer;

forming successively a second gate stack layer and a second conductive layer which cover the first gate stack layer;

forming a metal gate structure which covers the second conductive layer;

forming a second mask pattern on the metal gate structure; and removing part of the metal gate structure, part of the second conductive layer, part of the second gate stack layer, part of the first gate stack layer, part of the high dielectric material layer, and part of the oxide layer based on the second mask pattern to form the fourth gate structure.

9. The method for manufacturing the semiconductor device of claim 1, wherein before forming the first barrier layer which covers the polycrystalline silicon layer, the method further comprises:

forming a first oxide layer which covers the polycrystalline silicon layer;

removing part of the first oxide layer to form a second oxide layer;

forming a high dielectric material layer and a first gate stack layer which cover the second oxide layer;

forming successively a second gate stack layer and a second conductive layer which cover the first gate stack layer; and removing the second conductive layer, the second gate stack layer, the first gate stack layer, the high dielectric material layer and the second oxide layer to expose the polycrystalline silicon layer.

10. A semiconductor device, comprising:

a substrate, wherein the substrate is provided with a first device area, a second device area, a third device area and a fourth device area, and a doping type of the first device area is different from a doping type of the second device area, a doping type of the third device area is different from a doping type of the fourth device area;

a gate oxide layer located on the first device area and the second device area;

a gate conductive layer located on the gate oxide layer;

a first gate structure, wherein the first gate structure comprises the gate conductive layer and the gate oxide layer, and the first gate structure is located on the first device area;

a second gate structure, wherein the second gate structure comprises the gate conductive layer and the gate oxide layer, and the second gate structure is located on the second device area;

wherein the gate conductive layer comprises a polycrystalline silicon layer, and the first gate structure and the second gate structure furtherly comprise a stack structure, the stack structure comprises a first barrier layer and a first conductive layer; the polycrystalline silicon layer is in direct contact with the gate oxide layer; the first barrier layer is located on the polycrystalline silicon layer, and the first barrier layer is in direct contact with the polycrystalline silicon layer; the first conductive layer is located on the first barrier layer;

a third gate structure located on the third device area of the substrate, wherein the third gate structure comprises an oxide layer and a high dielectric material layer, wherein the oxide layer is in direct contact with the substrate, and the high dielectric material layer is in direct contact with the oxide layer;

a stress regulation layer formed by selective epitaxy located on the fourth device area of the substrate, wherein the stress regulation layer is in direct contact with a surface of the substrate; and a fourth gate structure located on the stress regulation layer, wherein the fourth gate structure comprises the oxide layer and the high dielectric material layer, wherein the oxide layer is in direct contact with the stress regulation layer, and the high dielectric material layer is in direct contact with the oxide layer.

11. The semiconductor device of claim 10, wherein a thickness of the gate oxide layer in the first device area and the second device area is greater than a thickness of the oxide layer in the third device area and the fourth device area.

12. The semiconductor device of claim 11, wherein the thickness of the gate oxide layer in a direction perpendicular to the substrate ranges from 4 nm to 8 nm.

13. The semiconductor device of claim 11, wherein the thickness of the oxide layer in a direction perpendicular to the substrate ranges from 0.5 nm to 2 nm.

14. A memory, comprising: a storage cell and a control circuit coupled to the storage cell;

the storage cell is configured to store data;

the control circuit is configured to control the storage cell to perform a read or write operation, wherein the control circuit comprises a semiconductor device comprising:

a substrate, wherein the substrate is provided with a first device area, a second device area, a third device area and a fourth device area, and a doping type of the first device area is different from a doping type of the second device area, a doping type of the third device area is different from a doping type of the fourth device area;

a gate oxide layer located on the first device area and the second device area;

a gate conductive layer located on the gate oxide layer;

a first gate structure, wherein the first gate structure comprises the gate conductive layer and the gate oxide layer, and the first gate structure is located on the first device area; and a second gate structure, wherein the second gate structure comprises the gate conductive layer and the gate oxide layer, and the second gate structure is located on the second device area;

wherein the gate conductive layer comprises a polycrystalline silicon layer, and the first gate structure and the second gate structure furtherly comprise a stack structure, the stack structure comprises a first barrier layer and a first conductive layer; the polycrystalline silicon layer is in direct contact with the gate oxide layer; the first barrier layer is located on the polycrystalline silicon layer, and the first barrier layer is in direct contact with the polycrystalline silicon layer; the first conductive layer is located on the first barrier layer;

a third gate structure located on the third device area of the substrate, wherein the third gate structure comprises an oxide layer and a high dielectric material layer, wherein the oxide layer is in direct contact with the substrate, and the high dielectric material layer is in direct contact with the oxide layer;

a stress regulation layer formed by selective epitaxy located on the fourth device area of the substrate, wherein the stress regulation layer is in direct contact with a surface of the substrate; and a fourth gate structure located on the stress regulation layer, wherein the fourth gate structure comprises the oxide layer and the high dielectric material layer, wherein the oxide layer is in direct contact with the stress regulation layer, and the high dielectric material layer is in direct contact with the oxide layer.

15. The memory of claim 14, wherein the storage cell comprises:

a transistor and a charge storage coupled to the transistor.

* * * * *